United States Patent
Kuzuno et al.

(10) Patent No.: US 7,260,012 B2
(45) Date of Patent: Aug. 21, 2007

(54) FUSE LATCH CIRCUIT

(75) Inventors: Naokazu Kuzuno, Kawasaki (JP);
Kimio Maruyama, Yokohama (JP);
Yasuhiro Hegi, Yokohama (JP);
Kiyoharu Oikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 10/777,971

(22) Filed: Feb. 13, 2004

(65) Prior Publication Data

US 2004/0218328 A1  Nov. 4, 2004

(30) Foreign Application Priority Data

Feb. 14, 2003  (JP) ............... 2003-037180

(51) Int. Cl.
*G11C 17/18* (2006.01)
(52) U.S. Cl. .................................. 365/225.7
(58) Field of Classification Search ............. 365/225.7; 265/225.7
See application file for complete search history.

(56) References Cited

U.S. PATENT DOCUMENTS

| | | | | |
|---|---|---|---|---|
| 5,619,469 | A | | 4/1997 | Joo .................... 365/225.7 |
| 5,929,691 | A | * | 7/1999 | Kim et al. ............... 327/525 |
| 6,134,177 | A | * | 10/2000 | Kang ................ 365/230.06 |
| 6,147,546 | A | * | 11/2000 | Verwegen ............... 327/525 |
| 6,150,868 | A | * | 11/2000 | Kim et al. ............... 327/525 |
| 6,308,230 | B1 | * | 10/2001 | Potter et al. ............. 710/64 |
| 6,320,800 | B1 | * | 11/2001 | Saito et al. ............. 365/200 |
| 6,509,598 | B2 | | 1/2003 | Okuda .................... 257/300 |

* cited by examiner

*Primary Examiner*—Stephen W. Jackson
*Assistant Examiner*—Scott Bauer
(74) *Attorney, Agent, or Firm*—Oblon, Spivak, McClelland, Maier & Neustadt, P.C.

(57) ABSTRACT

One end of a fuse is connected to a ground point via a transistor N1A, and the other end thereof is connected to a node VaA. For example, at a fuse connection case, when INTV="H" is input to the gate of the transistor N1A, the node VaA becomes "L." At INTV="L", a transistor P1A having a low "on" resistance turns ON, and the node VaA is quickly precharged. At INTV="H", the transistor N1A turns ON, and the node VaA is quickly discharged.

20 Claims, 8 Drawing Sheets

FUSE LATCH CIRCUIT

CROSS-REFERENCE TO RELATED APPLICATIONS

This application is based upon and claims the benefit of priority from prior Japanese Patent Application No. 2003-37180, filed Feb. 14, 2003, the entire contents of which are incorporated herein by reference.

BACKGROUND OF THE INVENTION

1. Field of the Invention

The present invention relates generally to a fuse latch circuit that latches a fuse state during a power-on initialization time period, and more particularly to a fuse latch circuit to be used with a redundancy-functionality-containing memory or a redundancy-functionality-containing memory embedded microcomputer, for which stable operation, low current consumption, and chip size reduction are demanded.

2. Description of Related Art

FIG. 1 shows an example of a conventional fuse latch circuit. FIG. 2 shows an example system using fuse latch circuits, one of which is shown in FIG. 1.

A fuse latch circuit group 110 is configured of 240 fuse latch circuits L0, L1, . . . , L239. An internal circuit 12 outputs respective control signals CNT0, CNT1, . . . , CNT239 in accordance with respective output signals FUSEOT0, FUSEOT1, . . . , FUSEOT239 of the fuse latch circuits L0, L1, . . . , L239.

Each fuse latch circuit Ln (where n=0, 1, . . . , 239) is configured of high "on" resistance p-channel MOS transistors P1 and P2, inverters INV1 and INV2, a resistor R, a fuse (such as an aluminum fuse) AL-fuse, and capacitors C1 and C2.

The capacitor C1 has the function of setting a node Va to a power supply level (VDD) at the power-on time. The capacitor C2 has the function of setting a node Vb to a ground level (VSS) at the power-on time. However, during system initialization, the node Va becomes the ground level, and the node Vb becomes the power supply level.

Other example fuse latch circuits are disclosed in, for example, Jpn. Pat. Appln. KOKAI Publications No. 2002-298594, No. 2000-311496, No. 2002-175696, No. 05-41096, and No. 2002-093188.

Fuse Connection Case

FIG. 3 shows operation of the fuse latch circuit shown in FIG. 1 in a fuse connection case (non-disconnection case).

First, in a time T1 or immediately before the system initialization, since a control signal INTV is set to an "H" level, the node Va becomes a ground level ("L" level). At this time, also the output signal FUSEOTn of the fuse latch circuit Ln becomes the "L" level.

At a system initialization time T2, since the control signal INTV becomes the "L" level, the p-channel MOS transistor P1 is set to an ON state. Consequently, the node Va enters a precharge state, and a current path occurs in the route "power supply→transistor P1→node Va→resistor R→fuse AL-fuse→ground point."

A let-through current in units of one fuse latch circuit in the above-described state is about 25 µA. However, assumptions are made that the power supply level (VDD) is about 3.3 V, and the temperature is normal temperature.

The system shown in FIG. 2 has the 240 fuse latch circuits L0, L1, . . . , L239. Individual operation timings of the fuse latch circuits L0, L1, . . . , L239 are identical to one another, so that a let-through current ivdd of about 6 mA in total flows across the overall system.

Consequently, the let-through current ivdd arises the probability of a power-supply potential fall. In addition, power consumption in a memory or a memory embedded microcomputer employed by the system is increased.

Further, to prevent potential variations in the node Va due to the let-through current ivdd, such a manner as to set a circuit threshold value of an inverter INV1 is frequently practiced. In this case, however, if the circuit threshold value of the inverter INV1 increases to the power supply level, a failure mode takes place. More specifically, the output signal FUSEOTn is set to "L" while it inherently is to be "H" in the system initialization time T2.

Fuse Disconnection Case

FIG. 4 shows operation of the fuse latch circuit shown in FIG. 1 in a fuse connection case.

First, in the time T1 or immediately before the system initialization, since the control signal INTV is set to an "H" level, the node Va becomes the ground level ("L" level). At this time, also the output signal FUSEOTn of the fuse latch circuit Ln becomes the "L" level.

At the system initialization time T2, since the control signal INTV becomes the "L" level, the p-channel MOS transistor P1 is changed to the ON state. Consequently, the node Va enters a precharge state. Precharge of the node Va requires a sufficiently long precharge time in association with the capacitance (=large) of the capacitor C1 and a conductance gmA (=high) of the high "on" resistance p-channel MOS transistor P1.

For the reason described above, when, for example, a pulse width of the control signal INTV, i.e., the time T2, is excessively short, the potential of the node Va is unable to reach a predetermined precharge level. As a consequence, a failure mode takes place in which the potential of the node Va remains unable to exceed the circuit threshold value of the inverter INV1, and the output signals FUSEOTn that should inherently becomes "H" changes to "L."

In addition, for example, when the pulse width of the control signal INTV varies, the redundancy functionality is disabled in a state where the pulse width is narrow. Consequently, faulty data is transferred to a system bus to be used as data such as instruction data or control data, so that a system failure is induced.

FIG. 5 shows an example layout for five units of the fuse latch circuits shown in FIG. 1.

Fuses AL-fuse are formed in a fuse area. In a transistor area, p-channel MOS transistors P1 and P2 and inverters INV1 and INV2 are formed in a transistor area. Wirelines W1, W2, and W3 are formed in a wireline area; resistors R are formed in a resistor area; and capacitors C1 and C2 are formed in a capacitor area.

The size necessary for one of the fuse circuits is about 588 µm² (i.e., about 73.2 µm×about 8.04 µm=about 588 µm²). Therefore, in the system shown in FIG. 2 having 240 fuse latch circuits, the area required for the fuse latch circuit group is about 141,247 µm² (i.e., about 73.2 µm×about 8.04 µm×240 units=about 141,247 µm²).

In recent years, there is the tendency of using an increased number of fuse latch circuits in one system, consequently increasing the ratio in the occupation area of a fuse latch circuit group in a memory-macro control circuit. Consequently, the chip size is increased in, for example, a memory or memory embedded microcomputer in which the system is mounted.

Accordingly, for an integrated circuit such as a memory or memory embedded microcomputer having fuse latch circuits, it is important to implement system stabilization and low current consumption by eliminating let-through current during the initial operation time. In addition, it is important to arrange the configuration not causing erroneous operation even when the pulse width of the control signal for initializing the system is narrow and to reduce the layout area of the fuse latch circuits.

BRIEF SUMMARY OF THE INVENTION

A fuse latch circuit according to an aspect of the invention comprises a fuse, a first inverter in which an input end is connected to one end of the fuse, a second inverter in which an input end is connected to an output end of the first inverter, a first transistor in which a first power supply potential is input to a source, a drain is connected to the one end of the fuse, and a pulse signal for initialization is input to a gate, a second transistor in which the first power supply potential is input to a source, a drain is connected to the one end of the fuse, and a gate is connected to the output end of the first inverter, and a third transistor in which a second power supply potential is input to a source, a drain is connected to the other end of the fuse, and the pulse signal is input to a gate, wherein conductance of the first transistor is higher than that of the second transistor.

DETAILED DESCRIPTION OF THE INVENTION

A fuse latch circuit of an aspect of the present invention will be described below in detail with reference to the accompanying drawings.

(1) First Embodiment

Figure 6:
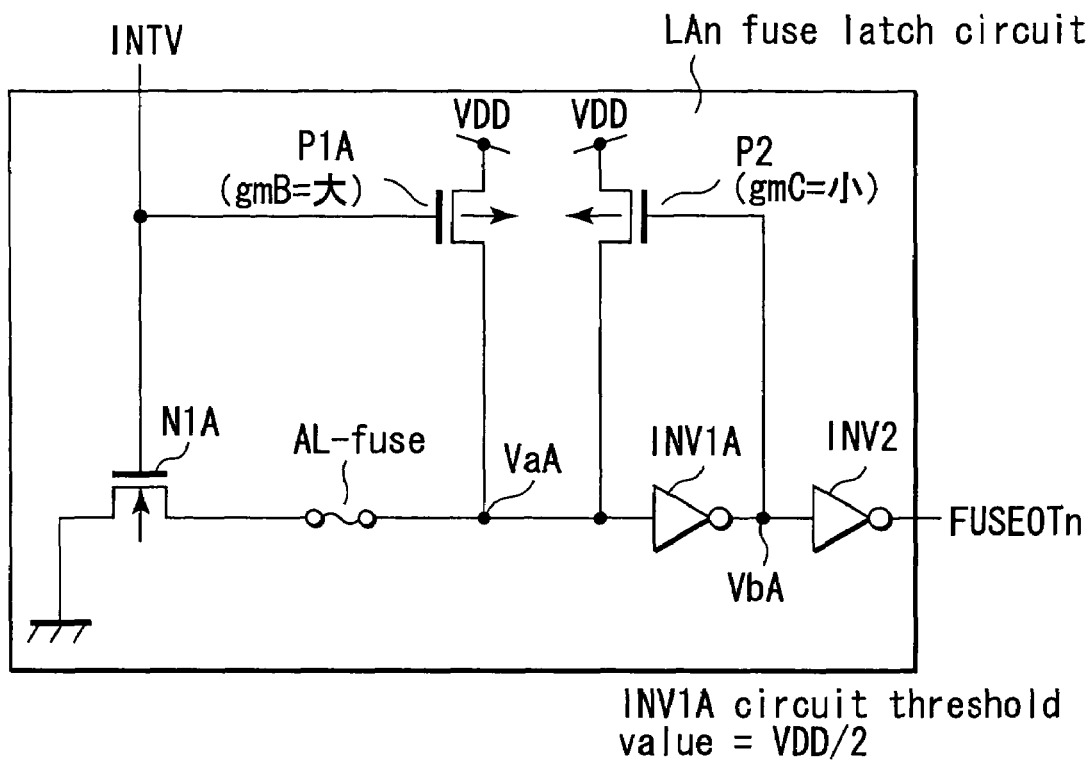
FIG. 6 is a circuit diagram showing a fuse latch circuit according to a first embodiment of the present invention.
Figure 7:
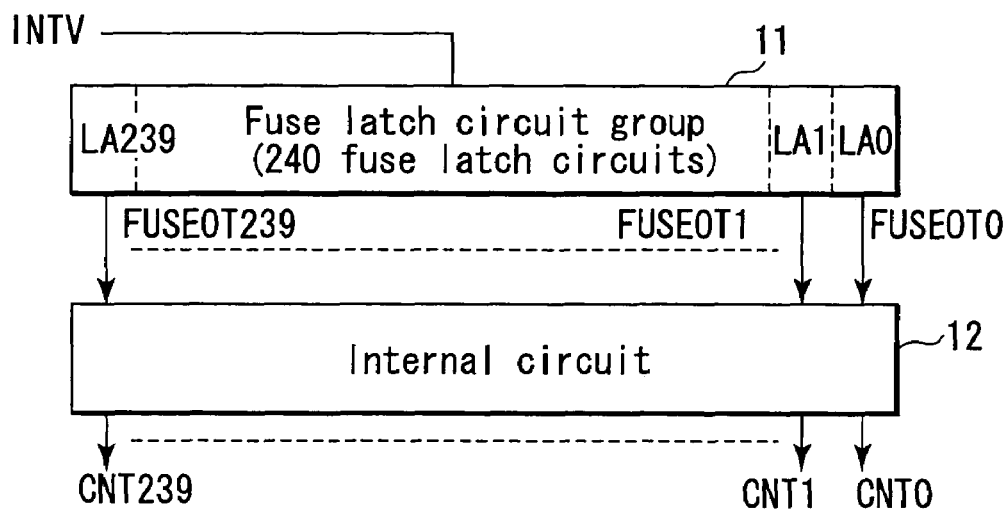
FIG. 7 is a view showing an example system using fuse latch circuits, one of which is shown in FIG. 6.

FIG. 6 shows an example fuse latch circuit according to a first embodiment of the invention. FIG. 7 shows an example system using fuse latch circuits, one of which is shown in FIG. 6.

A fuse latch circuit group 11 is configured of 240 fuse latch circuits LA0, LA1, . . . , LA239. An internal circuit 12 outputs respective control signals CNT0, CNT1, . . . , CNT239 in accordance with respective output signals FUSEOT0, FUSEOT, . . . , FUSEOT239 of the fuse latch circuits LA0, LA1, . . . , LA239.

Each fuse latch circuit LAn (where n=0, 1, . . . , 239) is configured of a low "on" resistance p-channel MOS transistor P1A, a high "on" resistance p-channel MOS transistor P2, an n-channel MOS transistor N1A, inverters INV1A and INV2, and a fuse (such as an aluminum fuse) AL-fuse.

Figure 1:
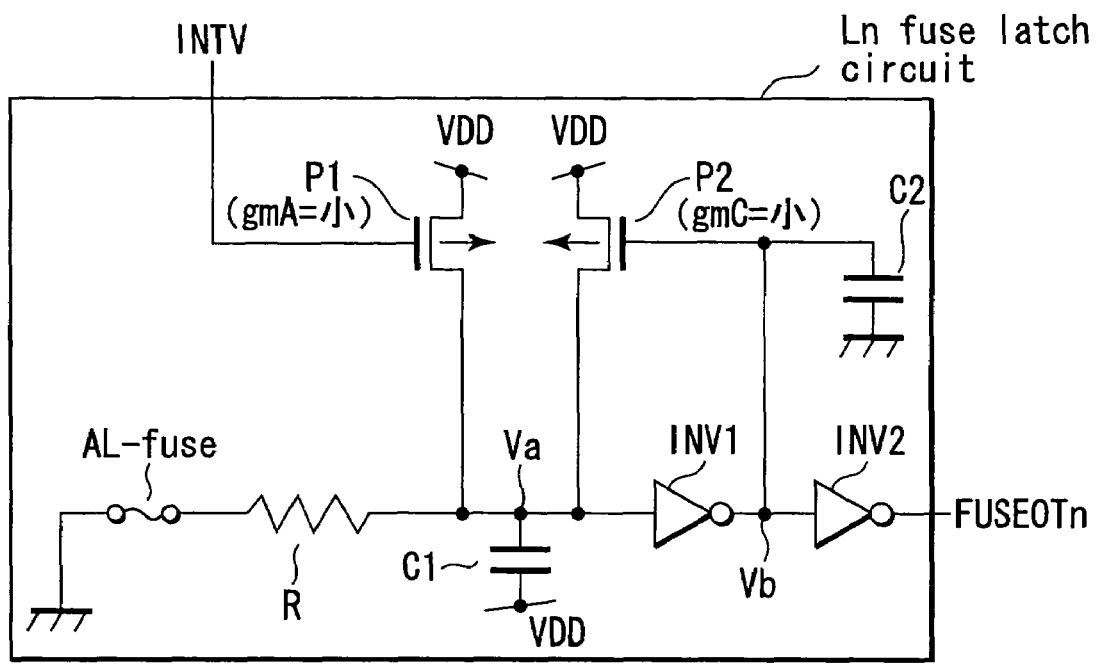
FIG. 1 is a circuit diagram showing a conventional fuse latch circuit.

In comparison with the fuse latch circuit Ln shown in FIG. 1, the fuse latch circuit LAn is different therefrom in that it has the n-channel MOS transistor N1A for preventing a let-through current, does not have the resistor R and capacitors C1 and C2, and has the p-channel MOS transistor P1A to replace the high "on" resistance p-channel MOS transistor P1.

Operations in a fuse connection case (non-disconnection case) and a fuse disconnection case will be described below.

Fuse Connection Case

Figure 8:
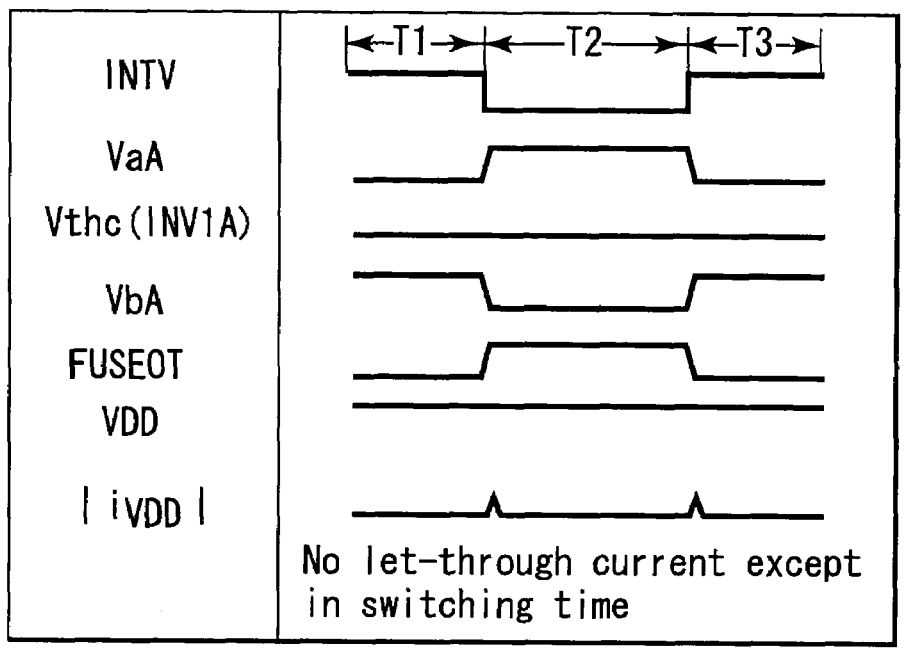
FIG. 8 is a waveform diagram showing operation of the fuse latch circuit shown in FIG. 6 in a fuse connection case.

FIG. 8 shows operation of the fuse latch circuit shown in FIG. 6 in a fuse connection case (non-disconnection case).

First, in a time T1 or immediately before the system initialization, a control signal INTV is set to an "H" level, the p-channel MOS transistor P1A is in an OFF state, and the n-channel MOS transistor N1A is in an ON state. Accordingly, a node VaA becomes the ground level ("L" level). At this time, also the output signal FUSEOTn of the fuse latch circuit LAn becomes the "L" level.

At the system initialization time T2, since the control signal INTV becomes the "L" level, the p-channel MOS transistor P1A enters the ON state, and the n-channel MOS transistor N1A becomes the OFF state. Consequently, the node VaA enters a precharge state. At this time, since the n-channel MOS transistor N1A is the OFF state, a current path in the route "power supply→transistor P1A→node VaA→fuse AL-fuse→ground point" does not occur, except at switch time.

In addition, the n-channel MOS transistor N1A is in the OFF state, and the p-channel MOS transistor P1A is a low "on" resistance MOS transistor (conductance gmB=high) having a low "on" resistance. As such, the node VaA is quickly precharged to the power supply level, whereby the output signal FUSEOTn of the fuse latch circuit LAn becomes an "H" level.

In a deterministic time T3, since the control signal INTV is again set to the "H" level, the p-channel MOS transistor P1A enters the OFF state, and the n-channel MOS transistor N1A enters the ON state. Accordingly, the node VaA is quickly is discharged to the ground level ("L" level). At this time, the output signal FUSEOTn of the fuse latch circuit LAn becomes the "L" level.

Fuse Disconnection Case

Figure 9:
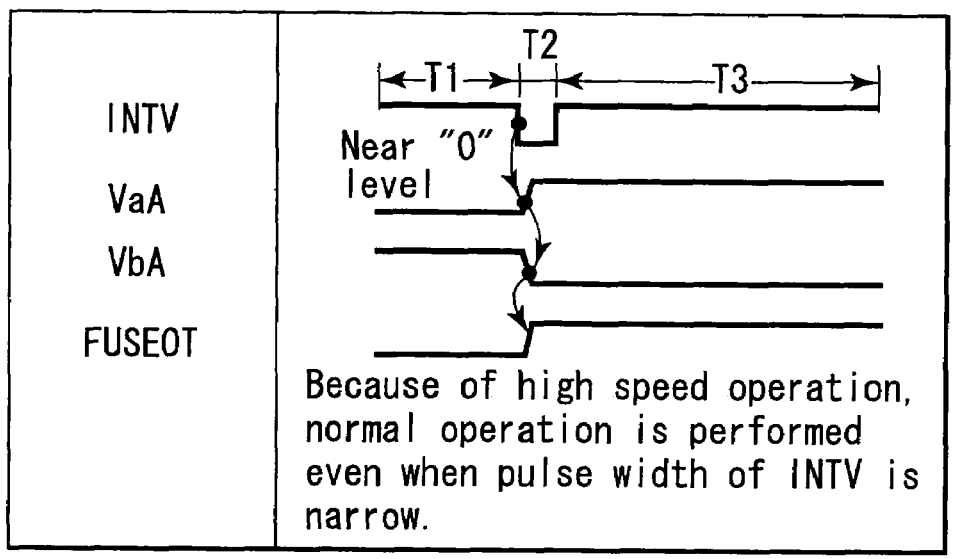
FIG. 9 is a waveform diagram showing operation of the fuse latch circuit shown in FIG. 6 in a fuse disconnection case.

FIG. 9 shows operation of the fuse latch circuit shown in FIG. 6 in a fuse disconnection case.

First, in a time T1 or immediately before the system initialization, a control signal INTV is set to an "H" level, the p-channel MOS transistor P1A is in an OFF state, and the n-channel MOS transistor N1A is in an ON state. Accordingly, a node VaA becomes the ground level ("L" level). At this time, also the output signal FUSEOTn of the fuse latch circuit LAn becomes the "L" level.

At the system initialization time T2, since the control signal INTV becomes the "L" level, the p-channel MOS transistor P1A changes to the ON state, and the n-channel MOS transistor N1A is changes to the OFF state. Consequently, the node VaA enters a precharge state. At this time, since the fuse AL-fuse is disconnected, a current path in the route "power supply→transistor P1A→node VaA→fuse AL-fuse→ground point" does not occur.

Further, the p-channel MOS transistor P1A is a low "on" resistance MOS transistor (conductance gmB=high) having a low "on" resistance, whereby the node VaA is quickly precharged to the power supply level. As such, even when the pulse width of the initialization control signal INTV, that is, the system initialization time T2 is short, the output signal FUSEOTn of the fuse latch circuit LAn becomes the "H" level, and the system does not cause an erroneous operation.

Moreover, after the output signal FUSEOTn of the fuse latch circuit LAn has changed to the "H" level, a high "on" resistance p-channel MOS transistor P2 (conductance gmC=low) enables the level of the output signal FUSEOTn to be stabilized.

As described above, according to the fuse latch circuit shown in FIG. 6, the layout area of the fuse latch circuit can be reduced by reducing the number of elements. In addition, with the n-channel MOS transistor N1A for preventing a let-through current from occurring, a let-through current during the initial operation time can be eliminated. Consequently, stabilization and low power consumption of the system can be implemented. Further, with the low "on" resistance transistor being used for the p-channel MOS transistor P1A provided to perform the precharge operation, the node VaA is quickly precharged. Consequently, the system does not cause an erroneous operation even when the pulse width of the initialization control signal is narrow.

In the fuse latch circuit shown in FIG. 6, a slight let-through current occurs in a switching operation during the fuse connection case, that is, during the time of switching the level ("H"/"L") of the control signal INTV. This problem can be solved in the manner that the circuit threshold value of the inverter INV1A provided to detect the level of the node VaA is set to the half of the power supply level, that is, VDD/2. This substantially eliminates the let-through current to improve the operational stability of the fuse latch circuit, consequently enabling the stabilization and low power consumption of the system to be implemented.

(2) Second Embodiment

Figure 10:
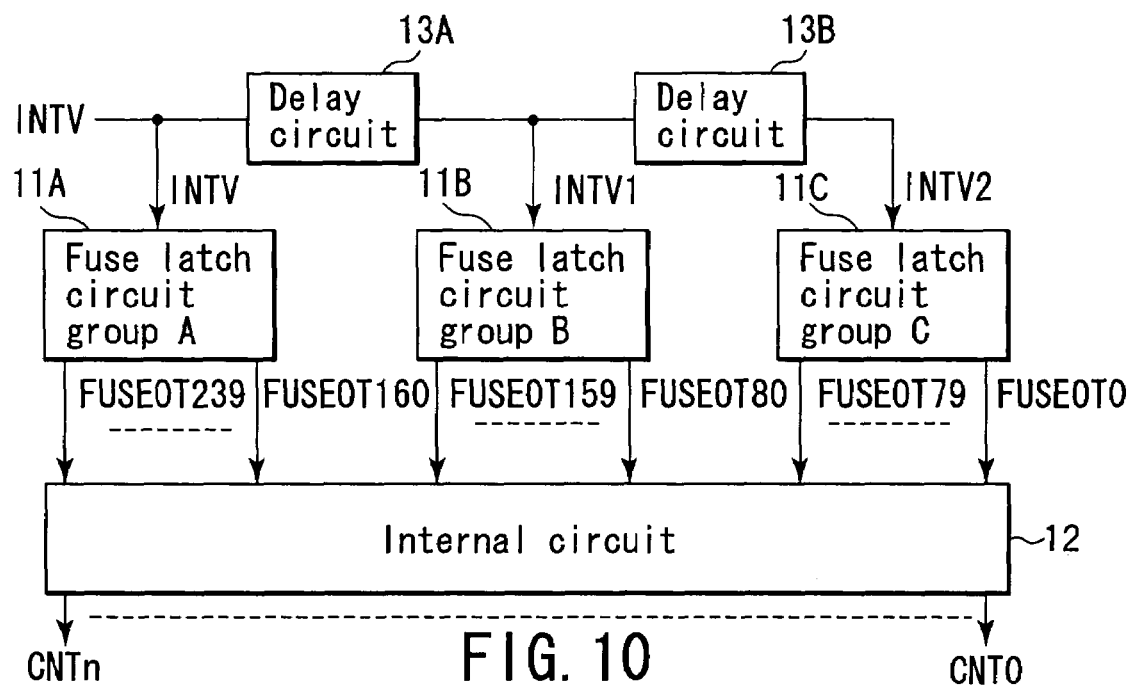
FIG. 10 is a diagram showing an example system according to a second embodiment of the invention.

FIG. 10 is an example system using fuse latch circuits according to a second embodiment of the present invention.

The second embodiment is a modified example of the first embodiment described above. In the second embodiment, an object is to reduce operation current and self-noise at the time of switching, that is, at the time of shifting from the time T1 to the time T2 and at the time of shifting from time T2 to the time T3.

The second embodiment has features in that a fuse latch circuit group constituted of a large number (240 units, for example) of fuse latch circuits is segmented into a plurality of fuse latch circuit groups, specifically, three fuse latch circuit groups 11A, 11B, and 11C, for example. Additionally, delay circuits 13A and 13B are provided to change the timing of feeding the initialization control signal INTV to each of the fuse latch circuit groups 11A, 11B, and 11C.

Thus, by causing the operation current flowing into the system to be distributed timewise at the switching time, cases are eliminated in which the operation current concurrently flows at certain time into all the fuse latch circuits, and the operation current can be reduced and self-noise can be reduced.

For each fuse latch circuit in each of the fuse latch circuit groups 11A, 11B, and 11C, the circuit shown in FIG. 6, for example, can be used without being modified.

Examples of the delay circuits 13A and 13B will be described hereunder.

Figure 11:
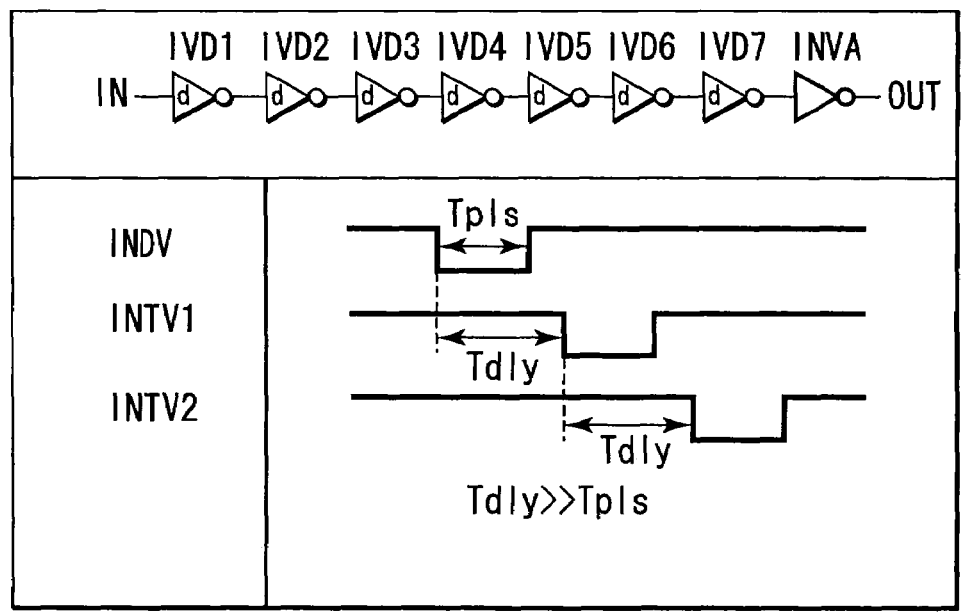
FIG. 11 is a diagram showing an example delay circuit in FIG. 10.

FIG. 11 is a diagram showing an example delay circuit in FIG. 10.

The delay circuits 13A and 13B are each configured of eight inverters series connected, as shown in FIG. 11. In this case, delay times tdly in the delay circuits 13A and 13B are the same.

In this case, care should be taken to set the delay time tdly in the delay circuit 13A, 13B is set longer than a pulse width Tpls of the initialization control signal INTV. More specifically, in the second embodiment, it is important that pulses (times in each of which the logic level is "L") of the control signals INTV, INTV1, and INTV2 do not overlap with one another.

Figure 12:
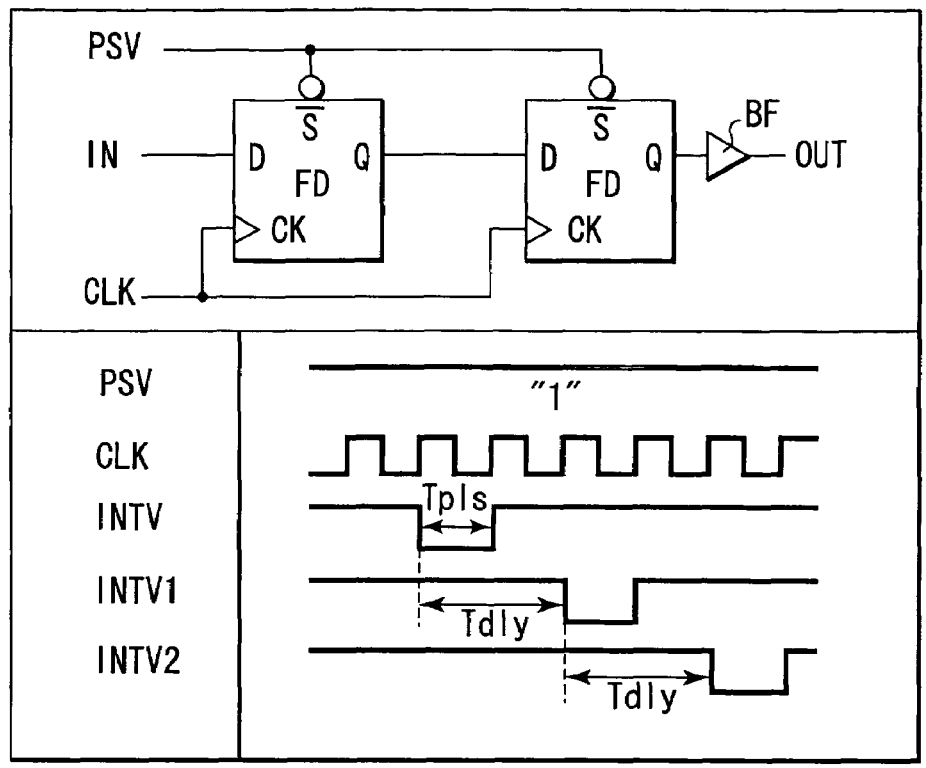
FIG. 12 is a diagram showing an example delay circuit in FIG. 10.

FIG. 12 shows examples of flipflop delay circuits FD.

As shown in FIG. 12, the delay circuits 13A, 13B are each configured of two flipflop delay circuits FD and a buffer BF, for example. When PSV is "H," the delay circuit 13A, 13B delays an input signal IN by a predetermined time tdly under control of a clock signal CLK and produces an output as an output signal OUT.

Similar to the delay circuit shown in FIG. 11, the delay time tdly in the delay circuit 13A, 13B is set longer than a pulse width Tpls of the initialization control signal INTV. That is, the delay times tdly are determined to meet a condition that requires pulses (times in each of which the logic level is "L") of the control signals INTV, INTV1, and INTV2 do not overlap with one another.

(3) Operational Verification

Operation verification was performed for the system shown in FIG. 7, which uses the fuse latch circuit shown in FIG. 6.

Figure 13:
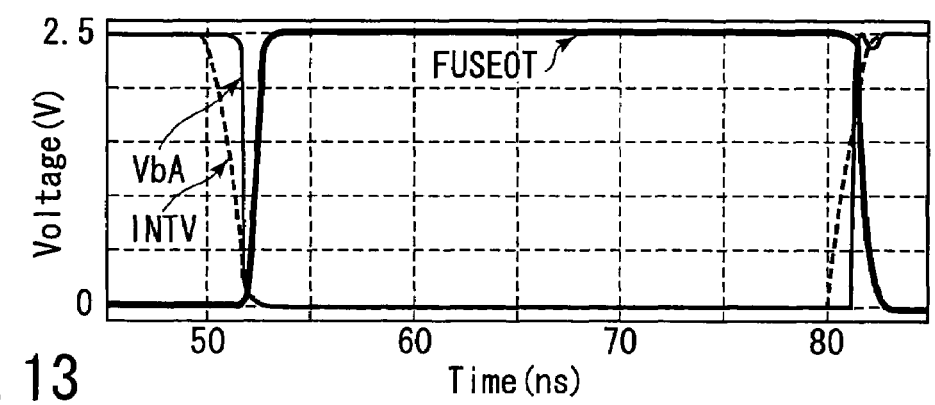
FIG. 13 shows a SPICE result for verification of high-speed operation.
Figure 14:
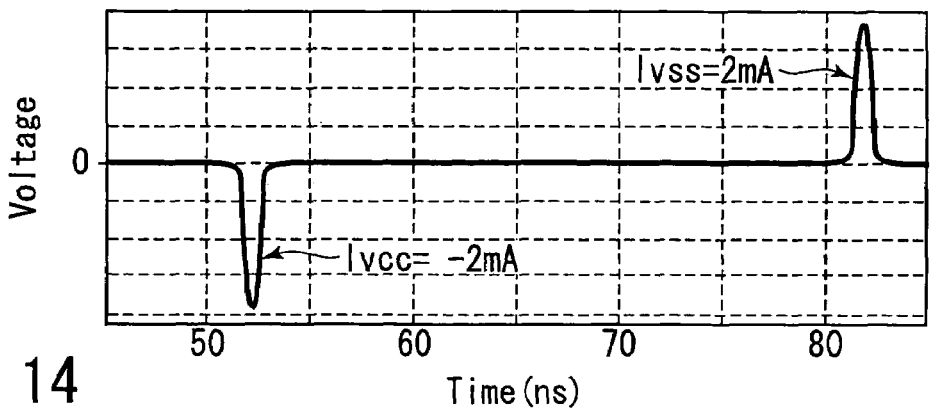
FIG. 14 shows a SPICE result for verification of reduction in a let-through current.

As shown in FIG. 13, when the power supply level (VDD) was set to 2.5 V, a response time tpd from an event where a control signal INTV has changed until an event where an output signal FUSEOT has changed was about 1.5 ns, whereby the high speed operation of the system could be verified. In addition, as shown in FIG. 14, a let-through current Ivcc, Ivss occurring at switching time was about 2 mA, so that the current could be reduced than that in the conventional case.

(4) Layout

Figure 15:
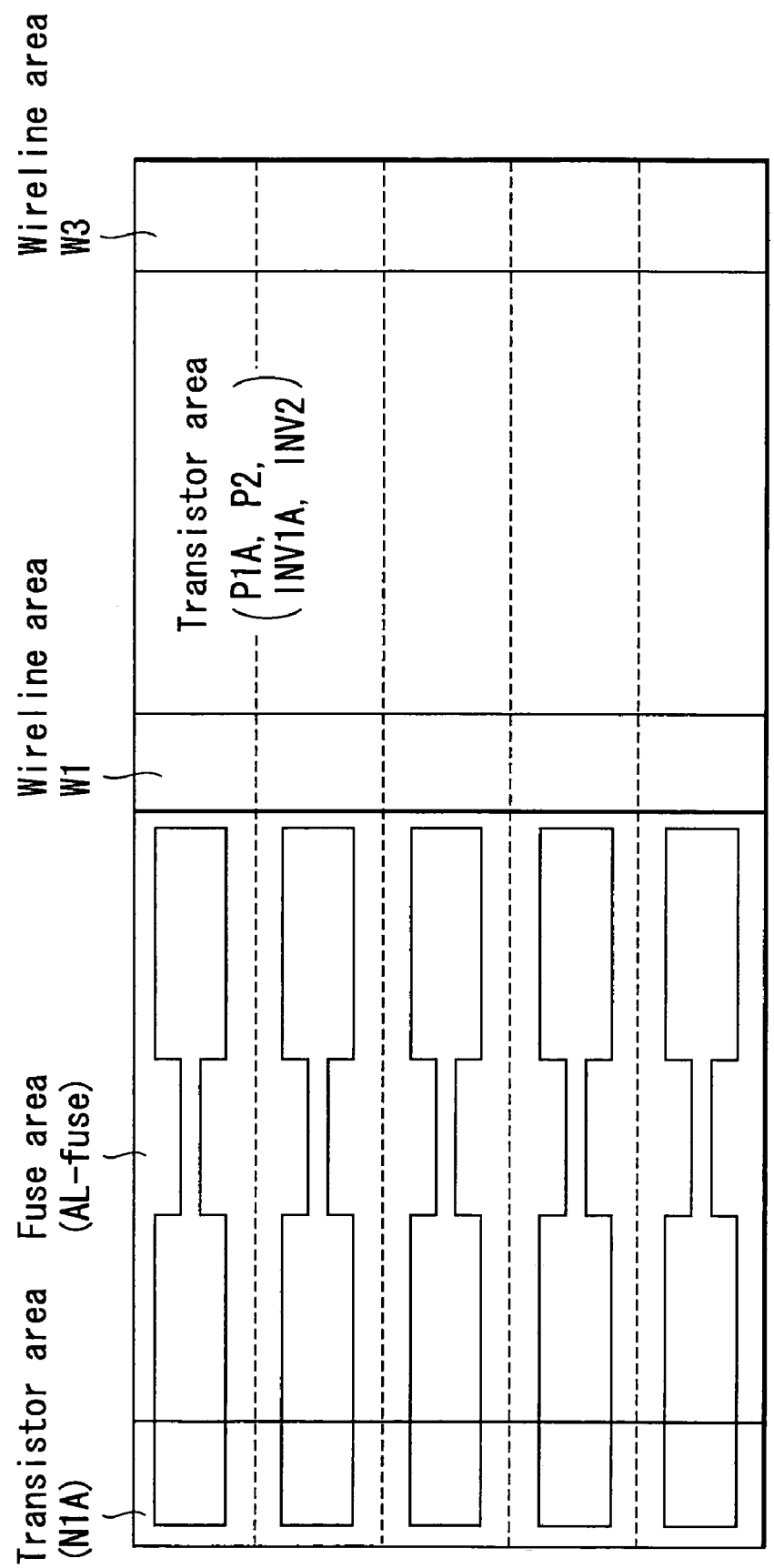
FIG. 15 is a diagram showing an example layout of the fuse latch circuits, one of which is shown in FIG. 6.

FIG. 15 is a diagram showing an example layout of five fuse latch circuits, one of which is shown in FIG. 6. This layout corresponds to the conventional layout shown in FIG. 5.

Fuses AL-fuse are formed in a fuse area. Transistors N1A, P1A, and P2 and inverters INV1A and INV2 are formed in a transistor area. Wirelines W1 and W3 are formed in a wireline area.

In this layout, an area in which resistors are formed and an area in which capacitors are formed are not present, the layout area can be reduced thereby. In addition, the low "on" resistance transistor (conductance gmB=high) is used for the precharging p-channel MOS transistor P1A. This can contributes to reducing the layout area.

In this layout, while the transistor area (N1A) is additionally provided, this area (N1A) can be disposed to overlap the fuse area (AL-fuse). More specifically, the n-channel MOS transistor N1A shown in FIG. 6 is formed immediately below an end portion (portion other than a disconnection portion) of the fuses AL-fuse, so that the layout area is not increased by the n-channel MOS transistor N1A.

More specifically, the size necessary for one of the fuse circuits is about 463.6 $\mu m^2$ (i.e., about 64.08 $\mu m \times$ about 7.08 $\mu m$=about 463.6 $\mu m^2$). Therefore, in the system shown in FIG. 7 having 240 fuse latch circuits, the area required for the fuse latch circuit group is about 108,884 $\mu m^2$ (i.e., about 64.08 $\mu m \times$ about 7.08 $\mu m \times$ 240 units=about 108,884 $\mu m^2$).

Figure 2:
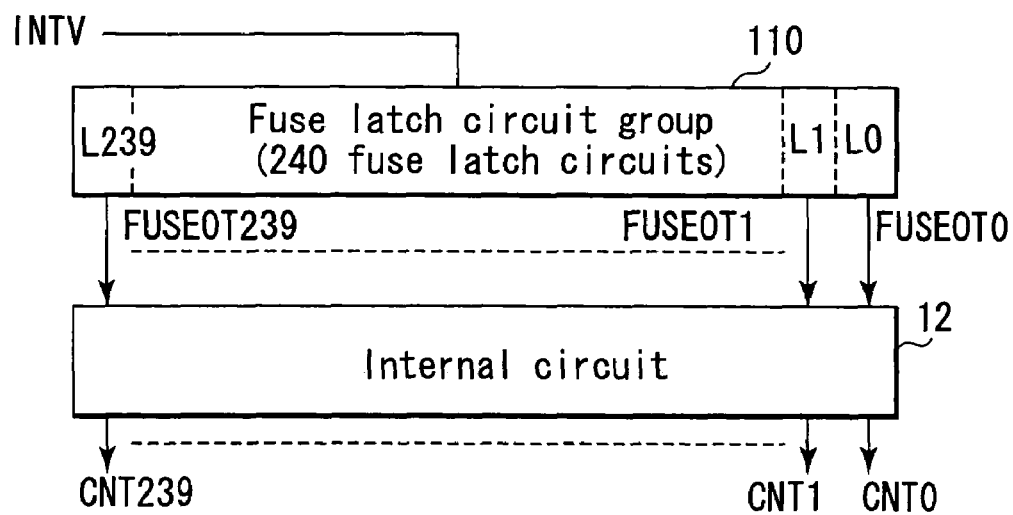
FIG. 2 is a diagram showing an example system using fuse latch circuits, one of which is shown in FIG. 1.
Figure 3:
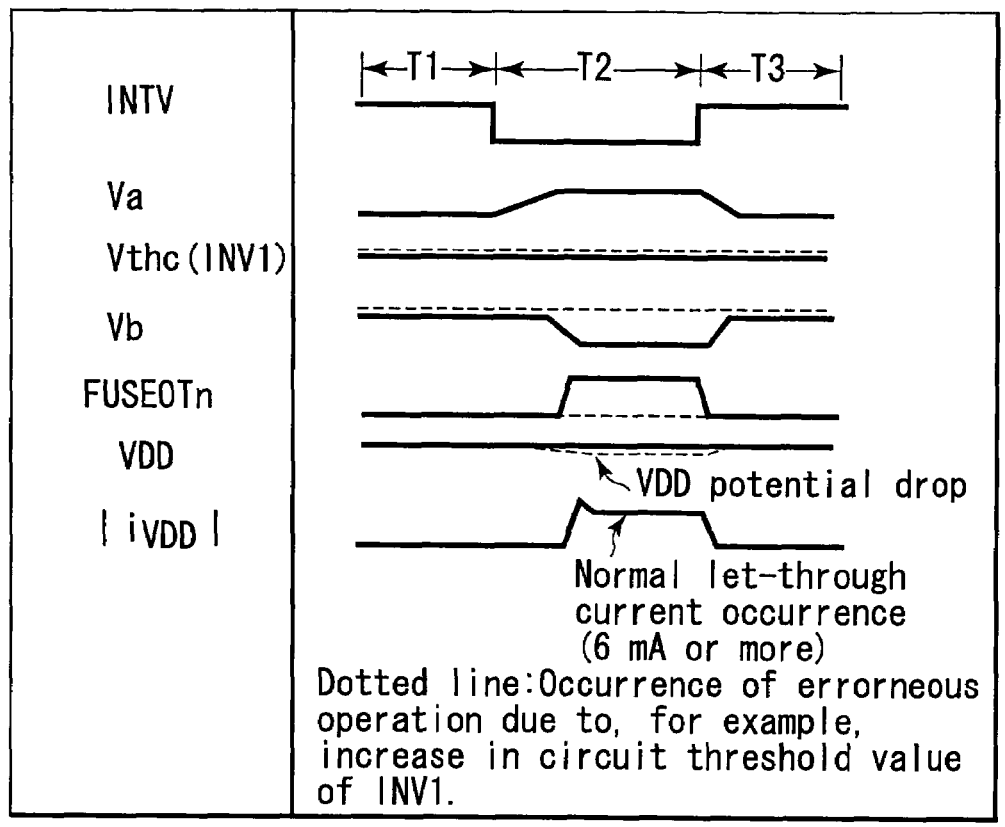
FIG. 3 is a waveform diagram showing operation of the fuse latch circuit shown in FIG. 1 in a fuse connection case.
Figure 4:
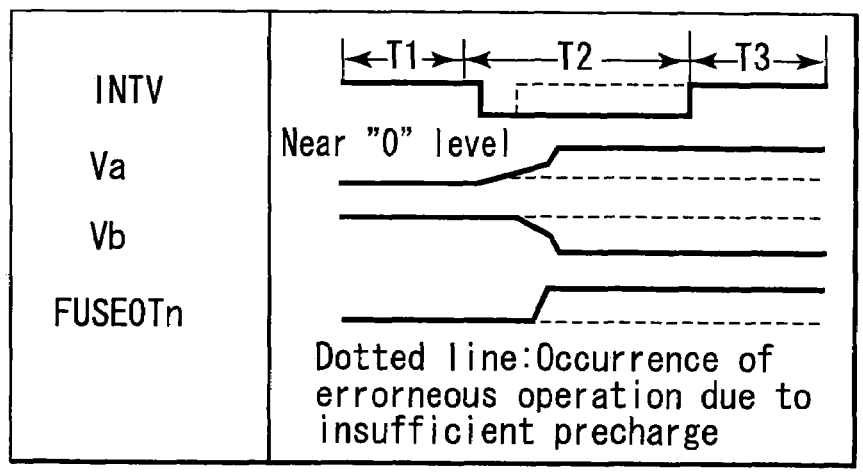
FIG. 4 is a waveform diagram showing operation of the fuse latch circuit shown in FIG. 1 in a fuse disconnection case.
Figure 5:
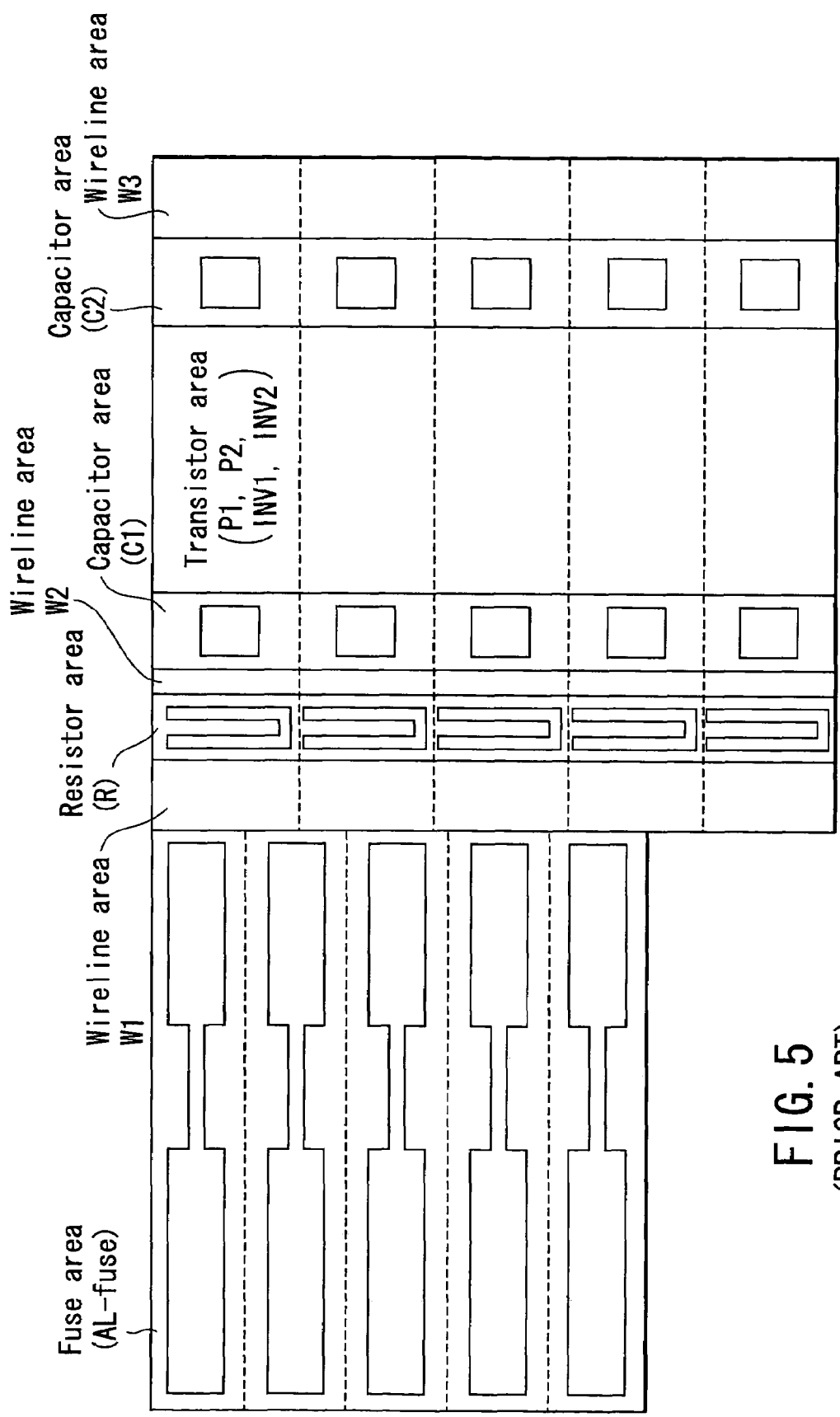
FIG. 5 is a view showing an example layout of the fuse latch circuit shown in FIG. 1.

In comparison, in the case of the layout shown in FIG. 5, the size necessary for one of the fuse latch circuits is about 588.5 $\mu m^2$ (i.e., about 73.2 $\mu m \times$ about 8.04 $\mu m$=about 588.5 $\mu m^2$). Therefore, in the system shown in FIG. 2 having 240 fuse latch circuits, the area required for the fuse latch circuit group is about 141,247 $\mu m^2$ (i.e., about 73.2 $\mu m \times$ about 8.04 $\mu m \times$ 240 units=about 141,247 $\mu m^2$).

As described above, according to the example of the invention, the memory cell of the system using the fuse latch circuits can be reduced by 20% or more. This contributes to the reduction of the chip size of, for example, a memory and memory embedded microcomputer in which the present system is mounted.

(5) Application Examples

By applying the fuse latch circuits of the invention and a system using the fuse latch circuits to a memory embedded microcomputer having redundancy functionality, let-through current during the initial operation time of the microcomputer can be substantially eliminated, and stabilization and low power consumption of the system can be implemented.

Further, since high speed precharge/discharge can be performed, even when the pulse width of the initialization control signal is short, an erroneous operation does not occur, consequently enabling reliability of the memory embedded microcomputer to be improved.

As described above, the fuse latch circuit, which has both the high speed operation and stable operation and which also enables the layout area to be reduced, can be used as a circuit for registering faulty addresses for the redundancy circuit of the memory in the microcomputer system for which high speed initialization is required. In addition, as in the second embodiment, in the configuration wherein the fuse latch circuit group is segmented into the plurality of fuse latch circuit groups, and the initialization timings of the individual fuse latch circuit groups are differentiated from one another, the reduction in the switching current and the reduction in the switching noise can be implemented.

By using the example of the invention, because of the reduction in the layout area of the fuse latch circuits and the system using the fuse latch circuits, the macro-size of a memory using redundancy functionality can be reduced.

(6) Others

For each of the first and second embodiments, modifications can be made regarding, for example, the power supply level, the ground level, and the conductive type of the transistors.

For example, regarding the power supply level and the ground level, the power supply level may be replaced with a first power supply level, and the ground level may be replace with a second power supply level lower than the first power supply level. In addition, the power supply level may be replaced with the ground level, or the ground level may be replaced with the power supply level. In this case, the transistors P1A and P2 are each replaced with an n-channel MOS transistor, and the transistor N1A is replaced with a p-channel MOS transistor.

Further, also the fuses AL-fuse is not limited to the laser arcing fuse described in the first and second embodiments, and the fuse may be replaced with an electrically-programmable electrical fuse.

Moreover, while the n-channel MOS transistor N1A is connected between the fuse AL-fuse and the ground point, the transistor may be connected between the fuse AL-fuse and the node VaA.

As described above, according to the individual embodiment of the invention, the system stabilization and low current consumption by eliminating let-through current during the initial operation time, the construction arrangement not causing erroneous operation even when the pulse width of the control signal for initializing the system is narrow, and the reduction in the layout area of the fuse latch circuits can be individually implemented for an integrated circuit such as a memory or memory embedded microcomputer having fuse latch circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fuse latch circuit comprising:
    a fuse;
    a first inverter in which an input end is connected to one end of the fuse;
    a second inverter in which an input end is connected to an output end of the first inverter;
    a first transistor of a first conductivity type, in which a first power supply potential is input to a source, a drain is connected to the one end of the fuse, and a pulse signal for initialization is input to a gate;
    a second transistor of the first conductivity type, in which the first power supply potential is input to a source, a drain is connected to the one end of the fuse, and a gate is connected to the output end of the first inverter; and
    a third transistor of a second conductivity type disposed immediately below the fuse, in which a second power supply potential is input to a source, a drain is connected to the other end of the fuse, and the pulse signal is input to a gate,
    wherein conductance of the first transistor is higher than that of the second transistor.

2. The fuse latch circuit according to claim 1, wherein a circuit threshold value of the first inverter is set to a half value of a total value of the first power supply potential and the second power supply potential.

3. A semiconductor integrated circuit comprising:
    a fuse latch circuit group comprised of a plurality of fuse latch circuits; and
    an internal circuit which receives output signals of the fuse latch circuit group, wherein each of said plurality of fuse latch circuits is the fuse latch circuit according to claim 1.

4. A semiconductor integrated circuit comprising:
a plurality of fuse latch circuit groups each comprised of a plurality of fuse latch circuits; and
an internal circuit which receives output signals of said plurality of fuse latch circuit groups,
wherein each of said plurality of fuse latch circuits is the fuse latch circuit according to claim 1, and the pulse signals are individually fed with different timings into said plurality of fuse latch circuit groups.

5. The semiconductor integrated circuit according to claim 4, wherein the pulse signals o be individually input to said plurality of fuse latch circuit groups do not overlap timewise with one another.

6. The semiconductor integrated circuit according to claim 5, wherein the timings with which the pulse signals are individually fed into said plurality of fuse latch circuit groups are controlled by a delay circuit having a delay time longer than at least a width of the pulse signal.

7. The fuse latch circuit according to claim 1, wherein the third transistor is formed immediately below an end portion of the fuse.

8. The fuse latch circuit according to claim 1, wherein the fuse latch circuit is used for a redundancy circuit of a memory.

9. The fuse latch circuit according to claim 1, wherein the fuse is an aluminum fuse.

10. The fuse latch circuit according to claim 1, wherein the fuse is an electrical fuse.

11. The fuse latch circuit according to claim 1, wherein the first transistor and the second transistor are each a p-channel MOS transistor.

12. The fuse latch circuit according to claim 1, wherein the third transistor is an n-channel MOS transistor.

13. The fuse latch circuit according to claim 1, wherein the second power supply potential is a ground potential.

14. The fuse latch circuit according to claim 1, wherein an output signal of the second inverter is fed into an internal circuit.

15. A memory comprising the fuse latch circuit according to claim 1.

16. A memory comprising the semiconductor integrated circuit according to claim 3.

17. A memory comprising the semiconductor integrated circuit according to claim 4.

18. A memory embedded microcomputer comprising the fuse latch circuit according to claim 1.

19. A memory embedded microcomputer comprising the semiconductor integrated circuit according to claim 3.

20. A memory embedded microcomputer comprising the semiconductor integrated circuit according to claim 4.

* * * * *